US011410960B2

(12) United States Patent
Seyama et al.

(10) Patent No.: US 11,410,960 B2
(45) Date of Patent: Aug. 9, 2022

(54) BONDING APPARATUS

(71) Applicant: SHINKAWA LTD., Tokyo (JP)

(72) Inventors: Kohei Seyama, Tokyo (JP); Tetsuya Utano, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 508 days.

(21) Appl. No.: 16/622,296

(22) PCT Filed: Feb. 1, 2018

(86) PCT No.: PCT/JP2018/003386
§ 371 (c)(1),
(2) Date: May 19, 2020

(87) PCT Pub. No.: WO2018/143330
PCT Pub. Date: Aug. 9, 2018

(65) Prior Publication Data
US 2020/0286850 A1    Sep. 10, 2020

(30) Foreign Application Priority Data
Feb. 3, 2017 (JP) .............................. JP2017-018863

(51) Int. Cl.
*H01L 23/00* (2006.01)
*H01L 21/683* (2006.01)

(52) U.S. Cl.
CPC .......... *H01L 24/74* (2013.01); *H01L 21/6838* (2013.01)

(58) Field of Classification Search
CPC combination set(s) only.
See application file for complete search history.

(56) References Cited

FOREIGN PATENT DOCUMENTS

| JP | 2000260799 | 9/2000 |
| JP | 2003076290 | 3/2003 |
| JP | 2009170587 | 7/2009 |
| JP | 2015195250 | 11/2015 |

OTHER PUBLICATIONS

"International Search Report (Form PCT/ISA/210) of PCT/JP2018/003386," dated Mar. 20, 2018, with English translation thereof, pp. 1-3.

*Primary Examiner* — Telly D Green
(74) *Attorney, Agent, or Firm* — JCIPRNET (57) ABSTRACT

A bonding apparatus includes a bonding stage on which either a rectangular substrate or a circular substrate can be installed; a first transport mechanism which transports the rectangular substrate from a first carry-in unit to the bonding stage and from the bonding stage to a first carry-out unit; and a second transport mechanism which transports the circular substrate from a second carry-in/out unit to the bonding stage and from the bonding stage to the second carry-in/out unit, in which a first transport path determined by the first transport mechanism and a second transport path determined by the second transport mechanism partially overlap.

9 Claims, 5 Drawing Sheets

BONDING APPARATUS

CROSS-REFERENCE TO RELATED APPLICATION

This application is a 371 application of an international PCT application serial no. PCT/JP2018/003386, filed on Feb. 1, 2018, which claims the priority benefit of Japan application JP2017-018863, filed on Feb. 3, 2017. The entirety of each of the abovementioned patent applications is hereby incorporated by reference herein and made a part of this specification.

BACKGROUND OF THE INVENTION

Technical Field

The present invention relates to a bonding apparatus which bonds a semiconductor chip to a substrate.

Related Art

Conventionally, a bonding apparatus which bonds a semiconductor chip to a surface of a rectangular substrate made of resin, glass, or the like has been widely known. In this bonding apparatus, the rectangular substrate is transported by being sucked and held with an arm having a suction member or by being placed on a planar transport unit such as a conveyor.

On the other hand, in recent years, it has also been proposed to bond a semiconductor chip to a circular substrate represented by a wafer instead of a rectangular substrate. Although the rectangular substrate is provided with a contactable region in an upper surface, the circular substrate often cannot be contacted in the upper surface. Further, it is obvious that the shape of the circular substrate is significantly different from that of the rectangular substrate. Therefore, when the circular substrate is transported, there is a need for an arm transport unit that sucks and holds a back surface of the circular substrate. Since suction holes arranged in the arm transport unit are usually disposed in a substantially circular arc shape in accordance with the shape of the circular substrate, it is difficult to use the suction holes in sucking and holding of the rectangular substrate.

SUMMARY

Problems to be Solved

As a result, conventionally, the bonding apparatus that handles the rectangular substrate cannot handle the circular substrate, and the bonding apparatus that handles the circular substrate cannot handle the rectangular substrate. For this reason, a user who handles both substrates needs to prepare both a bonding apparatus for rectangular substrate and a bonding apparatus for circular substrate, which requires a large installation space and a large cost burden.

Therefore, the present invention discloses a bonding apparatus that can perform bonding to both the rectangular substrate and the circular substrate, and can attain miniaturization.

Means to Solve Problems

The bonding apparatus disclosed in the present application includes a bonding stage on which either a rectangular substrate or a circular substrate can be installed; a first transport mechanism which transports the rectangular substrate from a first carry-in unit to the bonding stage and from the bonding stage to a first carry-out unit; and a second transport mechanism which transports the circular substrate from a second carry-in unit to the bonding stage and from the bonding stage to a second carry-out unit, in which a first transport path determined by the first transport mechanism and a second transport path determined by the second transport mechanism partially overlap.

The space required for securing the transport path can be reduced by making the first transport path and the second transport path partially overlap each other. As a result, a bonding apparatus which is small-sized and capable of bonding both the rectangular substrate and the circular substrate can be obtained.

Here, the term "overlap" includes not only a case in which a part of each of the first transport path and the second transport path is directed toward the same direction at the same position, but also a case in which the first transport path and the second transport path intersect and overlap each other only in a dotted manner. Further, as for the overlap, it is sufficient that at least the horizontal ranges overlap each other, and the vertical range may not necessarily overlap each other.

In addition, the bonding apparatus may be switchable between a first state in which the first transport mechanism is enabled and the second transport mechanism is disabled, and a second state in which the first transport mechanism is disabled and the second transport mechanism is enabled.

With such a configuration, the type of substrate to be handled can be switched between a rectangular substrate and a circular substrate.

In addition, the first transport mechanism may have a planar transport unit which defines a planar path on which the rectangular substrate is transported, the second transport mechanism may have an arm transport unit which transports the circular substrate, and by movement of the planar transport unit, the first state and the second state may be switched.

With such a configuration, it is possible to prevent interference between the first transport mechanism and the second transport mechanism and selectively transport both the rectangular substrate and the circular substrate.

In addition, the planar transport unit may be able to swing and move around an axis extending in a longitudinal direction of the planar transport unit, and the arm transport unit may be able to move upward and downward; in the first state, the arm transport unit may move downward, and the planar transport unit may be located above the arm transport unit; and in the second state, the arm transport unit may move upward, and the planar transport unit may be located on a lateral side of the arm transport unit.

In addition, the planar transport unit may be a carry-out planar transport unit which transports the rectangular substrate from the bonding stage to the first carry-out unit, and the arm transport unit may be disposed in the middle from the bonding stage to the first carry-out unit.

In addition, the first carry-in unit and the first carry-out unit may be arranged on the left and right sides toward a front surface of the bonding apparatus, and the first transport path may extend in a left-right direction; and the second carry-in unit and the second carry-out unit may be arranged on a front side toward the front surface of the bonding apparatus, and the second transport path may be bent once or more.

With such a configuration, since the positions of the carry-in unit and the carry-out unit of the rectangular substrate become the same as those of an existing bonding apparatus for rectangular substrate, and the positions of the carry-in unit and the carry-out unit of the circular substrate become the same as those of an existing bonding apparatus for circular substrate, the user can handle the apparatus in the same way as the existing apparatus.

In addition, the circular substrate may be a wafer.

In addition, the bonding stage may include a base portion, and an adapter which is freely attachable to and detachable from the base portion, and is alternatively selected and mounted on the base portion, depending on the type of a substrate to be handled.

With such a configuration, it is possible to cope with various substrates with a single bonding stage.

In addition, the bonding apparatus further includes a substrate holding unit which holds a lower surface of the circular substrate when the circular substrate is transported to the bonding stage in the second state, in which the substrate holding unit may retreat to a position at which the substrate holding unit does not interfere with the first transport mechanism in the first state.

Effect

According to the bonding apparatus disclosed in the present application, the space required for securing the transport path can be reduced by making the first transport path and the second transport path partially overlap each other. As a result, a bonding apparatus which is small-sized and capable of bonding both the rectangular substrate and the circular substrate can be obtained.

DESCRIPTION OF THE EMBODIMENTS

Figure 1:
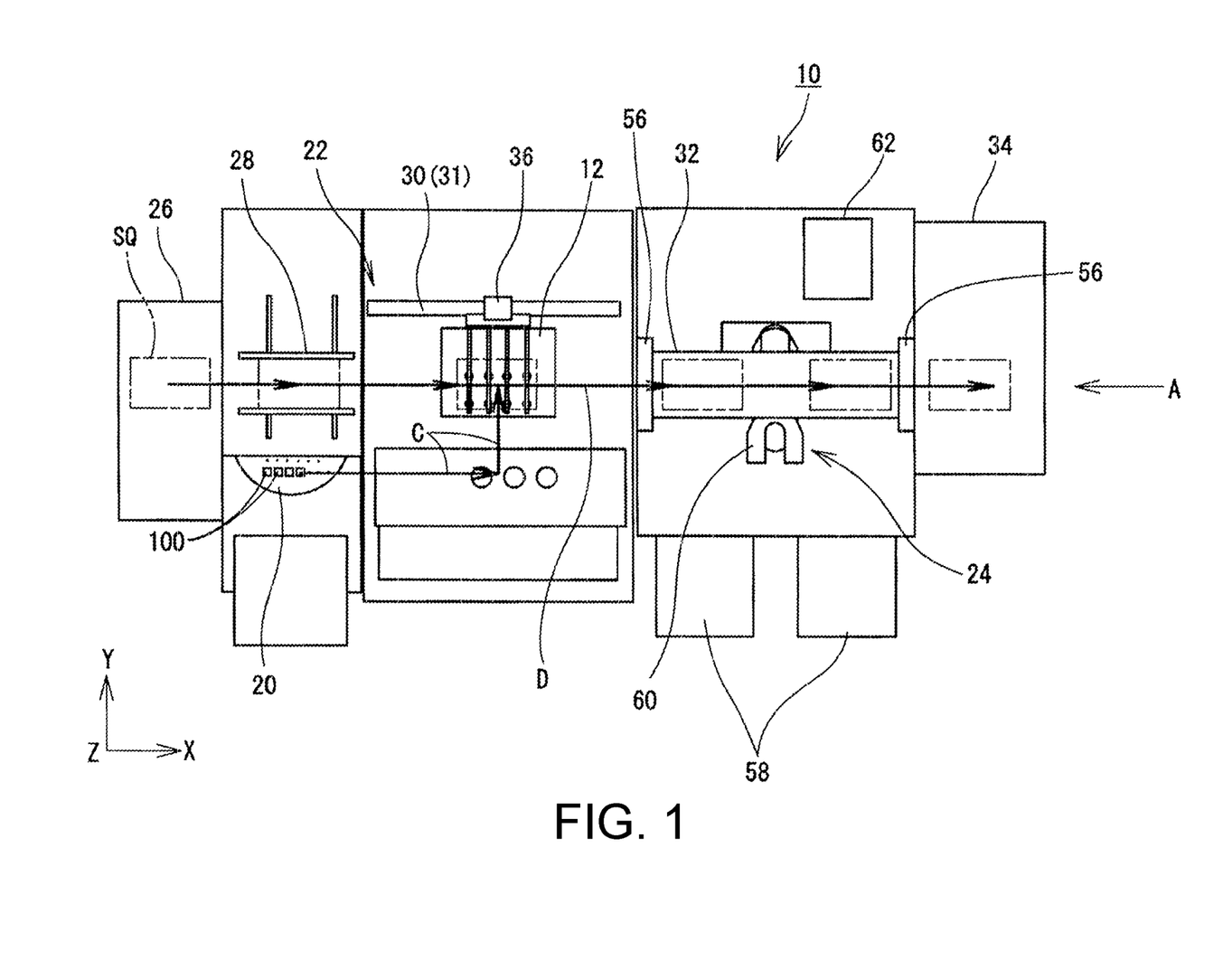
FIG. 1 is a schematic plan view of a bonding apparatus in a first state.
Figure 2:
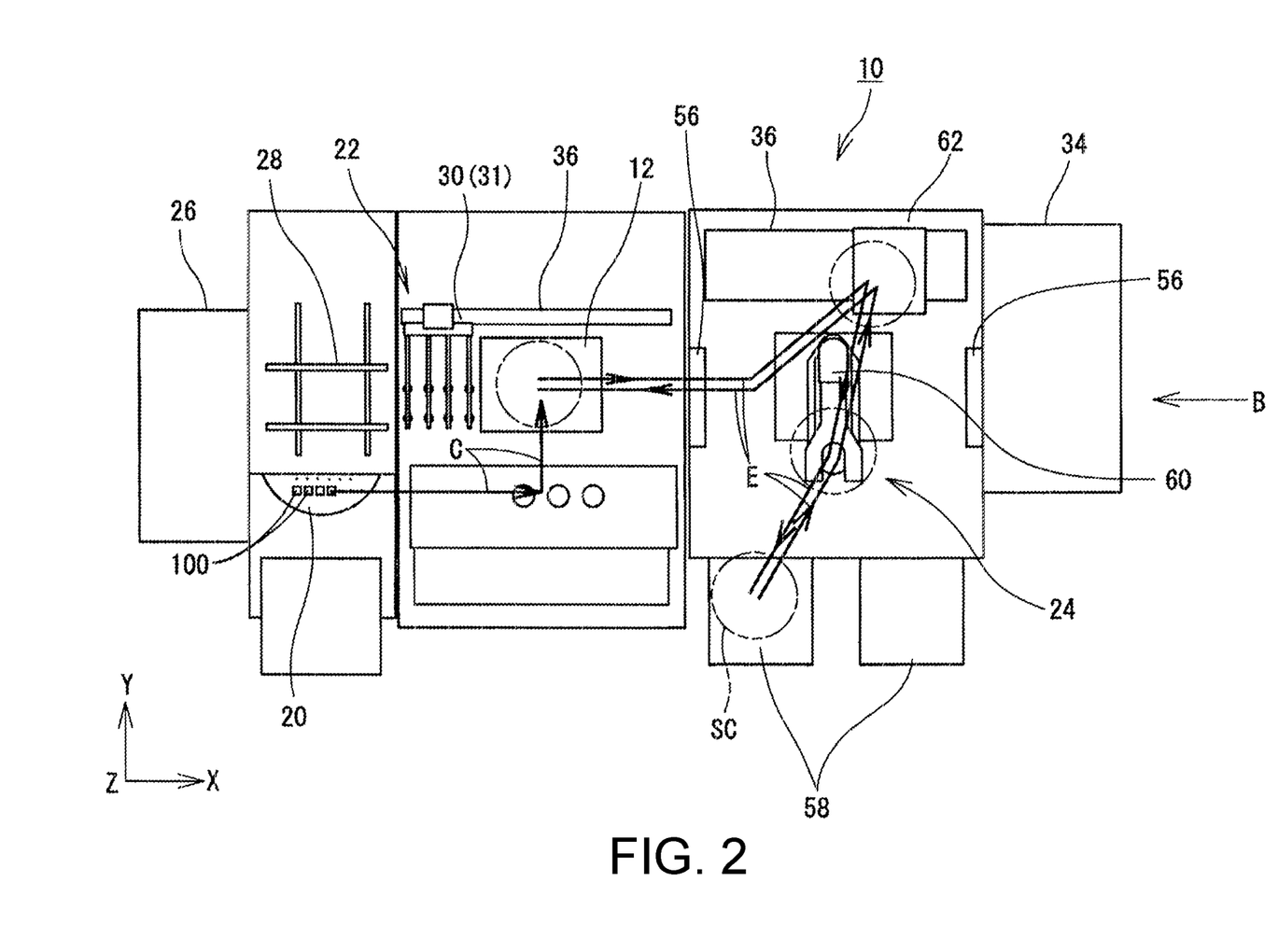
FIG. 2 is a schematic plan view of the bonding apparatus in a second state.
Figure 3:
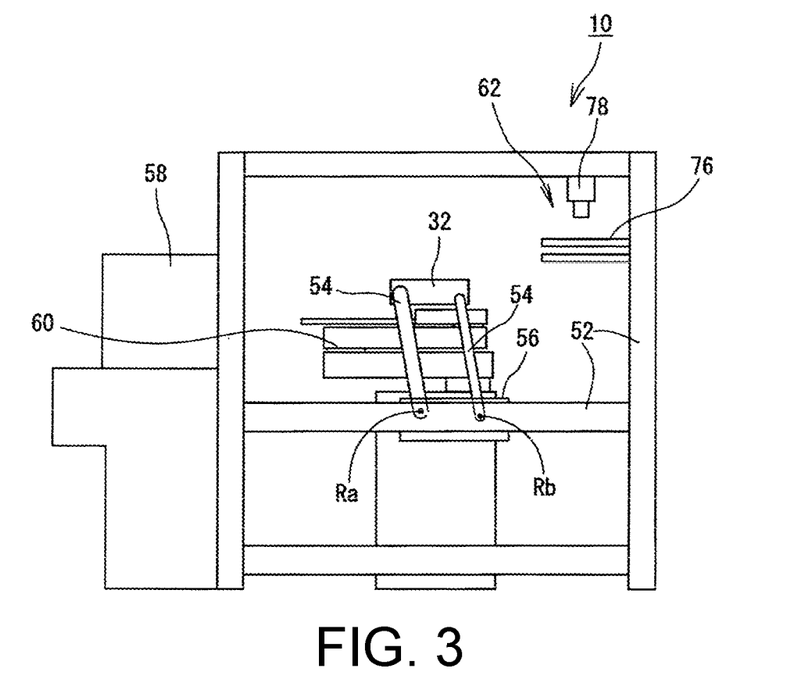
FIG. 3 is a diagram as viewed in a direction A of FIG. 1.
Figure 4:
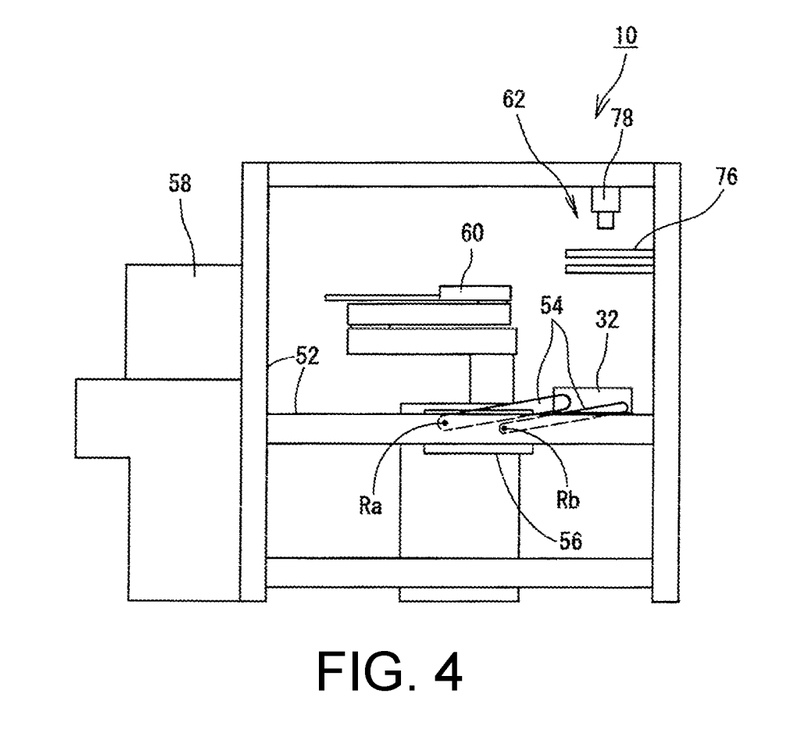
FIG. 4 is a diagram as viewed in a direction B of FIG. 2.

Hereinafter, a configuration of a bonding apparatus 10 is described with reference to the drawings. FIG. 1 is a schematic plan view of the bonding apparatus 10 in a first state, and FIG. 2 is a schematic plan view of the bonding apparatus 10 in a second state. FIG. 3 is a diagram as viewed in a direction A of FIG. 1, and FIG. 4 is a diagram as viewed in a direction B of FIG. 2.

The bonding apparatus 10 is an apparatus which bonds one or more semiconductor chips 100 onto upper surfaces of substrates SQ and SC. The bonding apparatus 10 is capable of handling both the rectangular substrate SQ having a substantially rectangular shape in a plan view and the circular substrate SC having a substantially circular shape in a plan view. When the semiconductor chip 100 is bonded to the rectangular substrate SQ, the bonding apparatus 10 is in the first state shown in FIG. 1 and FIG. 3. When the semiconductor chip 100 is bonded to the circular substrate SC, the bonding apparatus 10 is in a second state shown in FIG. 2 and FIG. 4.

The rectangular substrate SQ is made of resin, glass, or the like. The rectangular substrate SQ partially has a contactable portion, and a suction arm 36 described later sucks and holds the contactable portion. A method of bonding the semiconductor chip 100 to the rectangular substrate SQ is hereinafter referred to as "COS" (Chip On Substrate).

The circular substrate SC is mainly a wafer. A surface of the circular substrate SC is required to be kept clean, and it is not possible to come into contact with the surface. Therefore, when the circular substrate SC is transport, a back surface of the circular substrate SC is sucked and held. In addition, a linear portion called an orientation flat or a cutout portion called a notch is arranged on a peripheral edge of the circular substrate SC, as a marker for adjusting a direction (a rotation angle) of the circular substrate SC. The method of bonding the semiconductor chip 100 to the circular substrate SC is hereinafter referred to as "COW" (Chip On Wafer). The bonding apparatus 10 disclosed in the present application can perform both the COS method and the COW method.

Figure 5:
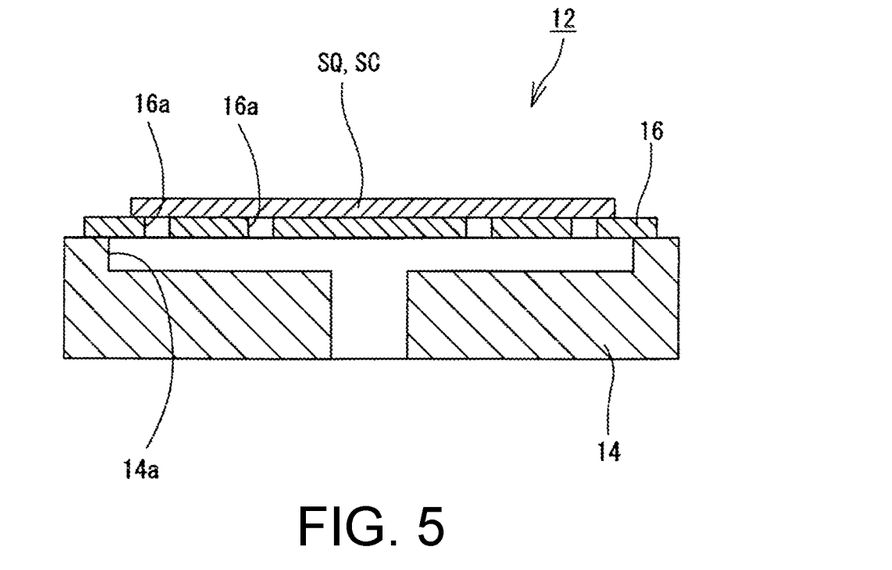
FIG. 5 is a schematic cross-sectional view of a bonding stage.

The bonding apparatus 10 includes a bonding stage 12 on which both the rectangular substrate SQ and the circular substrate SC can be placed. The bonding stage 12 can be moved in a horizontal direction (an X direction and a Y direction of FIG. 1 and FIG. 2) by a driving mechanism not shown. FIG. 5 is a schematic cross-sectional view of the bonding stage 12. The bonding stage 12 is formed by mounting an adapter 16 on an upper surface of a base portion 14. A suction recess 14a connected to a suction pump (not shown) is formed on the upper surface of the base portion 14.

The adapter 16 is a flat plate member having a size which completely covers the suction recess 14a, and is freely attachable to and detachable from the base portion 14. A plurality of types of adapters 16 is prepared corresponding to the sizes and shapes of the substrates SQ and SC to be handled, and the adapter 16 selected alternatively and appropriately is attached to the base portion 14. A plurality of suction holes 16a corresponding to the sizes and shapes of the corresponding substrates SQ and SC is formed in the adapter 16. The substrates SQ and SC placed on the adapter 16 are sucked and held via the suction holes 16a and the suction recess 14a. The number and position of the suction holes 16a of the adapter 16 are the number and position corresponding to the sizes and shapes of the substrates SQ and SC to be handled. In this way, in the bonding apparatus 10 disclosed in the present application, since the adapter 16 can be replaced depending on the size and shape of the substrates SQ and SC to be handled, various substrates SQ and SC can be appropriately held by a single bonding stage 12.

A bonding head (not shown) is arranged directly above the bonding stage 12. The bonding head bonds the semiconductor chip 100, which is supplied by a chip supply mechanism 18, to the substrates SQ and SC. The bonding head can be used for both the COS method and the COW method. However, it is not required that one bonding head can cope with both the COS method and the COW method. A bonding head for the COW method may be arranged separately from the bonding head for the COS method.

The chip supply mechanism 18 picks up and transports the semiconductor chip 100 in a chip supply source 20, and supplies the semiconductor chip 100 to the bonding head. Since a known related art can be used as the configuration of the chip supply mechanism 18, detailed description thereof is omitted here. As shown in FIG. 1 and FIG. 2, the chip supply source 20 is arranged on a front side of the bonding stage 12 and on a lateral side in the X direction. The chip supply mechanism 18 transports the semiconductor chip 100 picked up in the chip supply source 20 in the X direction, and then transports the semiconductor chip 100 to the bonding stage 12 side in the Y direction. An arrow C in FIG. 1 and FIG. 2 indicates a transport path of the semiconductor chip 100. The bonding head receives the semiconductor chip 100 from the chip supply mechanism 18 and bonds the semiconductor chip 100 to the substrates SQ and SC.

The rectangular substrate SQ is transported by a first transport mechanism 22, and the circular substrate SC is transported by a second transport mechanism 24, respectively. First, the first transport mechanism 22 will be described with reference to FIG. 1 and FIG. 3. When the rectangular substrate SQ is transported, the first state is reached in which the first transport mechanism 22 is enabled and the second transport mechanism 24 is disabled.

The first transport mechanism 22 includes a first carry-in unit 26, a feeder 28, a suction arm mechanism 30, a carry-out conveyor 32, a first carry-out unit 34, and the like. The first carry-in unit 26 and the first carry-out unit 34 are arranged on both sides in the X direction with the bonding stage 12 interposed therebetween, that is, on the left and right sides toward the front surface of the bonding apparatus 10. The first carry-in unit 26 has a loader (not shown) which supplies the rectangular substrate SQ to the feeder 28, and the first carry-out unit 34 has an unloader (not shown) which receives the rectangular substrate SQ transported by the carry-out conveyor 32.

The rectangular substrate SQ supplied by the feeder 28 is sent by the feeder 28 to a downstream side in the X direction (the right side in FIG. 1, and the bonding stage 12 side). Moreover, the feeder 28 may be a mechanism such as a conveyor, or may be a feed mechanism having plural pairs of rollers for pinching the rectangular substrate SQ and sending it downstream.

The suction arm mechanism 30 places the rectangular substrate SQ sent by the feeder 28 on the bonding stage 12, and transports the rectangular substrate SQ after the bonding process to the carry-out conveyor 32. The suction arm mechanism 30 includes a rail 31 extending in the X direction, and a suction arm 36 that moves along the rail 31. The rail 31 is arranged on an opposite side of the chip supply mechanism 18 in the Y direction with the bonding stage 12 interposed therebetween.

Figure 6:
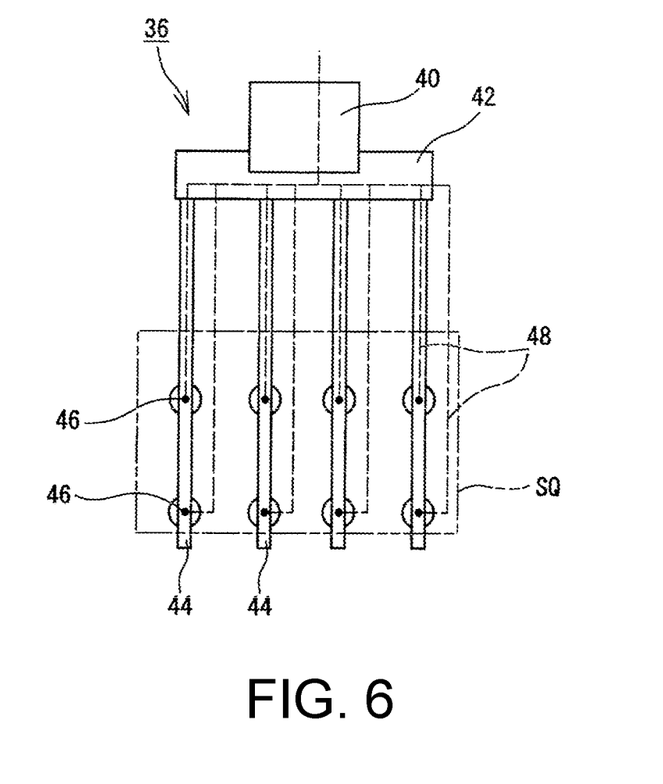
FIG. 6 is a view showing a schematic configuration of a suction arm.

FIG. 6 is a diagram showing a schematic configuration of the suction arm 36. The suction arm 36 includes a moving block 40 that moves along the rail 31, a base end portion 42 fixed to the moving block 40, and a plurality of (four in the shown example) arms 44 extending from the base end portion 42 toward the front side in the Y direction (the bonding stage 12 side). Each arm 44 has a hollow structure, and a suction pipe 48 is built inside the arm 44. In addition, a plurality of (two in the shown example) suction holes 46 is formed on the bottom surface of each arm 44. The suction pipe 48 causes the suction hole 46 to communicate with a suction pump not shown. The upper surface of the rectangular substrate SQ is sucked and held via the suction holes 46 and the suction pipes 48.

Figure 7:
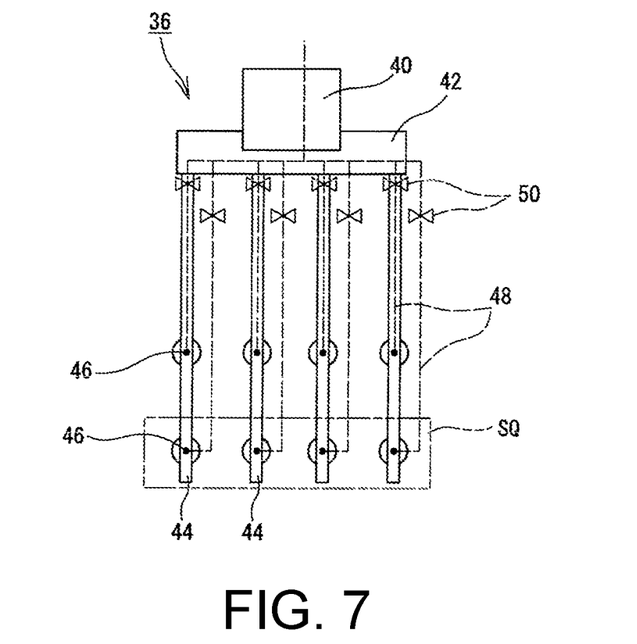
FIG. 7 is a view showing another example of the suction arm.

Moreover, as shown in FIG. 7, a valve 50 may be arranged in the middle of the suction pipe 48 communicating with each suction hole 46, and the suction hole 46 capable of performing suction may be switched by opening and closing the valve 50. With such a configuration, even if the size of the rectangular substrate SQ to be handled changes, the rectangular substrate SQ can be suitably held while preventing air leakage.

The carry-out conveyor 32 functions as a planar transport unit that defines a planar transport path for transporting the rectangular substrate SQ after the bonding process to the first carry-out unit 34. The carry-out conveyor 32 has an endless annular belt stretched over a pair of rollers, and the upper surface of the annular belt is moved downstream by rotationally moving the rollers with a motor. The suction arm 36 places the rectangular substrate SQ after the bonding process on the upper surface of the annular belt. The rectangular substrate SQ placed on the upper surface of the annular belt is transported to the downstream end of the carry-out conveyor 32, and is recovered to the first carry-out unit by the unloader.

Here, in the first state (when the rectangular substrate SQ is handled), the carry-out conveyor 32 is located between the bonding stage 12 and the first carry-out unit 34 and above the wafer transport robot 60 as shown in FIG. 1 and FIG. 3. In this case, the rectangular substrate SQ is transported in the X direction and along a linear transport path D (see FIG. 1) passing through the bonding stage 12. On the other hand, in the second state (when the circular substrate SC is handled), the carry-out conveyor 32 retreats to the lateral side of the wafer transport robot 60, that is, the back side in the Y direction, as shown in FIG. 2 and FIG. 4. In other words, the carry-out conveyor 32 can swing about an axis parallel to the transport path D of the rectangular substrate SQ.

In this way, in order to swing the carry-out conveyor 32, both ends of the carry-out conveyor 32 in the X direction are attached to the frame 52 via the pair of link members 54 and the support member 56 (see FIG. 3 and FIG. 4). The frame 52 is formed by, for example, combining angle members having a substantially square cross section. The support member 56 is fixed to the frame 52. One ends of the pair of link members 54 are rotatably attached to the support member 56. In addition, a motor (not shown) for rotating the link member 54 and the like are also arranged inside the support member 56.

The link member 54 is attached to the support member 56 at one end, and to the end portion of the carry-out conveyor 32 in the X direction at the other end in a freely rotatable manner. When the link member 54 rotates about rotation axes Ra and Rb arranged near one end, the carry-out conveyor 32 swings around an axis parallel to the transport path D. Moreover, two link members 54 are attached to the end portion of the carry-out conveyor 32 in the X direction with intervals in the Y direction. Therefore, even if the carry-out conveyor 32 swings with the rotation of the link member 54, the posture of the carry-out conveyor 32 does not change, and the upper surface of the annular belt on which the rectangular substrate SQ is placed remains in a state of facing right above.

Next, the second transport mechanism 24 will be described with reference to FIG. 2 and FIG. 4. The second transport mechanism 24 includes a carry-in/out unit 58, a wafer transport robot 60, a wafer rotating mechanism 62, and the like. The carry-in/out unit 58 is a carry-in unit (a second carry-in unit) and a carry-out unit (a second carry-out unit) of the circular substrate SC, and accommodates the circular substrate SC before and after the bonding process. A plurality of circular substrates SC is stacked in the carry-in/out unit 58 at intervals in a Z direction. As is evident from FIG. 2, the carry-in/out unit 58 is arranged on the front side in the Y direction, that is, on the front side toward the front surface of the bonding apparatus 10 with respect to the wafer transport robot 60 and the carry-out conveyor 32.

In this way, the carry-in/out unit 58 of the circular substrate SC is disposed on the front side toward the front surface, and the first carry-in unit 26 and the first carry-out unit 34 of the rectangular substrate SQ are disposed on both the left and right sides toward the front surface. The reason for such arrangement is to match the existing bonding apparatus. That is, COW bonding apparatus and COS bonding apparatus are currently distributed on the market. In many of the conventional COW bonding apparatus, a carry-in unit and a carry-out unit of the circular substrate SC are disposed on the front side toward the front surface of the apparatus. In addition, in many conventional COS bonding apparatus, the carry-in unit of the rectangular substrate SQ is disposed on the left side toward the front surface of the apparatus, and the carry-out unit is disposed on the right side toward the front surface of the apparatus. Although the bonding apparatus 10 disclosed in the present application is an apparatus capable of performing both COW and COS, the positions of the carry-in units and the carry-out units of each of the substrates SQ and SC are arranged at substantially the same positions as those of the conventional apparatus so that a user handles the bonding apparatus 10 in the same manner as the conventional COW apparatus and COS apparatus.

In this example, although the carry-in unit and the carry-out unit of the circular substrate SC are the same, they may be separated. Even in such a case, it is desirable to dispose both the carry-in unit and the carry-out unit of the circular substrate SC on the front side toward the front surface of the bonding apparatus 10.

The wafer transport robot 60 functions as an arm transport unit, and is an articulated robot that transports the substrate by sucking and holding the bottom surface of the circular substrate SC. The wafer transport robot 60 is arranged on the right side of the bonding stage 12 in the X direction, in other words, in the middle of the transport path D of the rectangular substrate SQ, as shown in FIG. 1 and FIG. 2.

Figure 8:
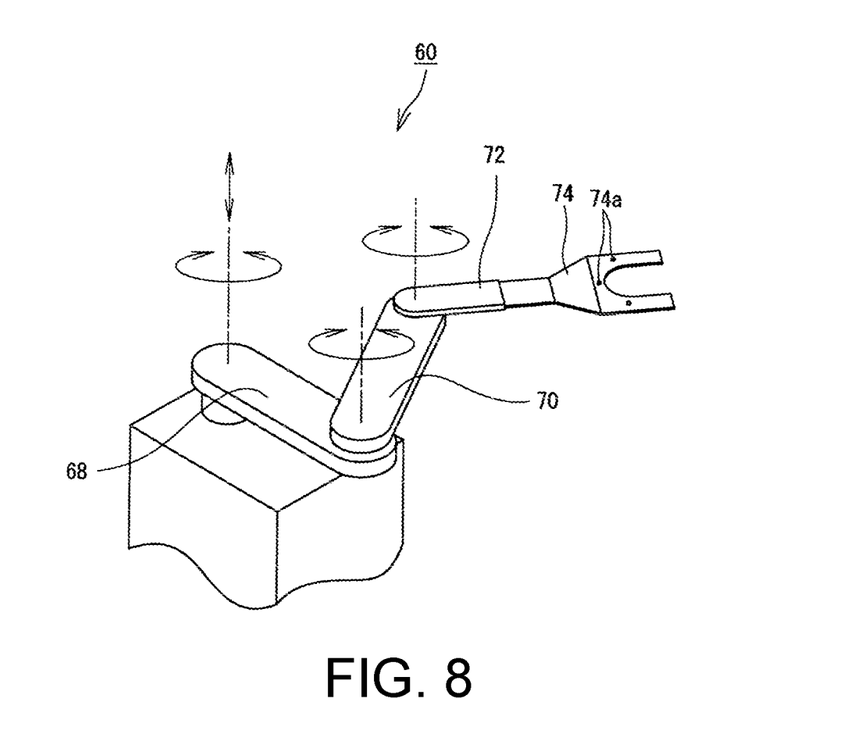
FIG. 8 is a schematic perspective view of a wafer transport robot.

FIG. 8 is a schematic perspective view of the wafer transport robot 60. The wafer transport robot 60 is not particularly limited as long as it includes a wafer suction arm 74 at the front end and has a sufficient movable range. In the example shown in FIG. 8, the wafer transport robot 60 is a horizontal articulated robot which includes a base arm 68 capable of rotating in a horizontal plane and moving straight in a vertical direction, an intermediate arm 70 capable of rotating in a horizontal plane, and a front arm 72 capable of rotating in the horizontal plane.

A wafer suction arm 74 is connected to the front end of the front arm 72. A plurality of suction holes 74a for sucking and holding the circular substrate SC is formed on a surface of the wafer suction arm 74. When the circular substrate SC is transported, the wafer transport robot 60 places the circular substrate SC on the upper surface of the wafer suction arm 74 and sucks the wafer, and drives the plurality of arms 68 to 72 in this state. Therefore, the wafer suction arm 74 or the front arm 72 to which the wafer suction arm 74 is attached functions as a substrate holding unit that holds the lower surface of the circular substrate SC when the circular substrate SC is transported to the bonding stage. As described later, the substrate holding unit (the wafer suction arm 74 or the front arm 72) retreats to a position at which it does not interfere with the first transport mechanism in the first state in which the first transport mechanism is enabled.

The wafer rotating mechanism 62 rotates the circular substrate SC transported by the wafer transport robot 60 as necessary, and adjusts the orientation (rotation angle) of the circular substrate SC. That is, when the semiconductor chip 100 is bonded to the circular substrate SC, it is necessary to align the orientation (rotation angle) of the circular substrate SC in a specified direction.

The wafer rotating mechanism 62 includes a rotating table 76 on which the circular substrate SC being transported is temporarily mounted, a camera 78 for capturing images of the circular substrate SC placed on the rotating table 76, and the like. A control unit (not shown) calculates the orientation (rotation angle) of the temporarily mounted circular substrate SC on the basis of the image captured by the camera 78, and rotates the rotating table 76 to set the orientation to a specified orientation. The circular substrate SC adjusted to the specified orientation by the rotating table 76 is held by the wafer transport robot 60 again and transported to the bonding stage 12.

Here, the wafer rotating mechanism 62 is located on the back side in the Y direction with respect to the wafer transport robot 60, and partially overlaps the carry-out conveyor 32 of the second state in the horizontal direction (see FIG. 2 and FIG. 4). However, as shown in FIG. 4, since the wafer rotating mechanism 62 is disposed above the carry-out conveyor 32 of the second state, interference between the wafer rotating mechanism 62 and the carry-out conveyor 32 is prevented.

The second transport mechanism 24 takes out the circular substrate SC from the carry-in/out unit 58, transports the circular substrate SC to the wafer rotating mechanism 62 on the back side of the apparatus, and then transports the circular substrate SC to the bonding stage 12 located substantially at the center of the apparatus. The circular substrate SC after the bonding process is transported in a direction opposite to the carry-in path. That is, the second transport mechanism 24 takes out the circular substrate SC after the bonding process from the bonding stage 12, transports the circular substrate SC to the wafer rotating mechanism 62 on the back side of the apparatus, and then transports the circular substrate SC to the carry-in/out unit 58 located on the front side of the apparatus. An arrow in FIG. 2 indicates the transport path E of the circular substrate SC determined by the second transport mechanism 24.

Moreover, in the second state of transporting the circular substrate SC, as shown in FIG. 4, the wafer transport robot 60 moves upward by moving the base arm 68 straight upward. On the other hand, in the first state of transporting the rectangular substrate SQ, as shown in FIG. 3, the wafer transport robot 60 moves downward by moving the base arm 68 straight upward, and is located below the carry-out conveyor 32. Thereby, it possible to switch between the first state and the second state while avoiding interference between the carry-out conveyor 32 and the wafer transport robot 60.

As is evident from the above description, the bonding apparatus 10 disclosed in the present application is able to handle both the rectangular substrate SQ and the circular substrate SC, and is able to execute both the COS method and the COW method. As a result, the cost and space can be significantly reduced as compared with a case in which both the COS bonding apparatus and the COW bonding apparatus are prepared. In addition, the bonding apparatus 10 disclosed in the present application can switch the method into the COS method or the COW method depending on demand. Therefore, when the demand of the COS method is high, the bonding apparatus 10 can be used as a COS apparatus, and when the demand of the COW method is high, the bonding apparatus 10 can be used as a COW apparatus. As a result, according to the bonding apparatus 10 disclosed in the present application, the production flexibility can be further improved and the non-operation time of the bonding apparatus 10 can be reduced, and thus the production efficiency can be further improved.

As is evident from a comparison between the transport path E in FIG. 2 and the transport path E in FIG. 1, a part of the transport path D determined by the first transport mechanism 22 and a part of the transport path E determined by the second transport mechanism 24 overlap each other. Specifically, both the transport paths D and E overlap each other in a section which connects the periphery of the wafer transport robot 60 and the bonding stage 12. By making the two types of transport paths D and E partially overlap each other in this way, the space required for securing the transport path can be reduced, and the bonding apparatus 10 which is small-sized and capable of coping with both the COS method and the COW method can be realized.

Moreover, the configurations described so far are merely examples, and as long as at least a part of the transport path of the rectangular substrate SQ determined by the first transport mechanism overlaps at least a part of the transport path of the circular substrate SC determined by the second transport mechanism, other configurations may be appropriately changed. Here, the term "overlap" includes not only a case in which a part of two transport paths D and E extends in the same direction at the same position as in this example, but also a case in which the two paths intersect and overlap each other only in a dotted manner. In addition, as for the term "overlap", at least the horizontal ranges may partially coincident with each other, and may be shifted in the vertical direction.

In addition, although the transport path of the carry-out conveyor 32 and the transport path of the wafer transport robot 60 are made to partially overlap in this example, the paths may be made to overlap each other at other locations. For example, the wafer transport robot 60 may be disposed near the feeder 28, and the transport path of the feeder 28 and the transport path of the wafer transport robot 60 may be made to partially overlap each other. In that case, the positions of the chip supply source 20 and the carry-in/out unit 58 are also changed as appropriate. In addition, in the present example, the carry-out conveyor 32 is used as a planar transport unit that defines a planar transport path for transporting the rectangular substrate SQ after the bonding process to the first carry-out unit 34; however, the planar transport unit may have another configuration. For example, in place of the carry-out conveyor 32, a mechanism that holds and transports only the end portion of the rectangular substrate SQ with a frame, a mechanism that sends the rectangular substrate SQ along a planar transport path with a pair of rollers, or the like may be used as a planar transport unit.

In addition, the configurations of the first transport mechanism 22 and the second transport mechanism 24 may be appropriately changed. For example, the rail 31 of the suction arm mechanism 30 may be extended, and the rectangular substrate SQ may be transported by the suction arm mechanism 30 from beginning to end.

What is claimed is:

1. A bonding apparatus comprising:
   a bonding stage on which either a rectangular substrate or a circular substrate is installable;
   a first transport mechanism which transports the rectangular substrate from a first carry-in unit to the bonding stage and from the bonding stage to a first carry-out unit; and
   a second transport mechanism which transports the circular substrate from a second carry-in unit to the bonding stage and from the bonding stage to a second carry-out unit,
   wherein a first transport path determined by the first transport mechanism and a second transport path determined by the second transport mechanism partially overlap.

2. The bonding apparatus according to claim 1, wherein the bonding apparatus is switchable between a first state in which the first transport mechanism is enabled and the second transport mechanism is disabled, and a second state in which the first transport mechanism is disabled and the second transport mechanism is enabled.

3. The bonding apparatus according to claim 2, wherein the first transport mechanism has a planar transport unit which defines a planar path on which the rectangular substrate is transported,
   the second transport mechanism has an arm transport unit which transports the circular substrate, and
   the first state and the second state are switched, by movement of the planar transport unit.

4. The bonding apparatus according to claim 3, wherein the planar transport unit is able to swing and move around an axis extending in a longitudinal direction of the planar transport unit,
   the arm transport unit is able to move upward and downward,
   in the first state, the arm transport unit moves downward, and the planar transport unit is located above the arm transport unit, and
   in the second state, the arm transport unit moves upward, and the planar transport unit is located on a lateral side of the arm transport unit.

5. The bonding apparatus according to claim 4, wherein the planar transport unit is a carry-out planar transport unit which transports the rectangular substrate from the bonding stage to the first carry-out unit, and
   the arm transport unit is disposed in the middle from the bonding stage to the first carry-out unit.

6. The bonding apparatus according to claim 5, wherein the first carry-in unit and the first carry-out unit are arranged on the left and right sides toward a front surface of the bonding apparatus, and the first transport path extends in a left-right direction, and
   the second carry-in unit and the second carry-out unit are arranged on a front side toward the front surface of the bonding apparatus, and the second transport path is bent once or more.

7. The bonding apparatus according to claim 1, wherein the circular substrate is a wafer.

8. The bonding apparatus according to claim 1, wherein the bonding stage comprises:
   a base portion, and
   an adapter which is freely attachable to and detachable from the base portion, and is alternatively selected and mounted on the base portion, depending on the type of a substrate to be handled.

9. The bonding apparatus according to claim 2, further comprising:
   a substrate holding unit which holds a lower surface of the circular substrate when the circular substrate is transported to the bonding stage in the second state,
   wherein the substrate holding unit retreats to a position at which the substrate holding unit does not interfere with the first transport mechanism in the first state.

* * * * *